United States Patent [19]

Ashe

[11] Patent Number: 5,495,245
[45] Date of Patent: Feb. 27, 1996

[54] DIGITAL-TO-ANALOG CONVERTER WITH SEGMENTED RESISTOR STRING

[75] Inventor: James J. Ashe, Saratoga, Calif.

[73] Assignee: Analog Devices, Inc., Norwood, Mass.

[21] Appl. No.: 233,820

[22] Filed: Apr. 26, 1994

[51] Int. Cl.$^6$ .................................................. H03M 1/68
[52] U.S. Cl. .......................................... 341/145; 341/153
[58] Field of Search ................................. 341/145, 144, 341/153

[56] References Cited

U.S. PATENT DOCUMENTS

| | | | |
|---|---|---|---|
| 3,997,892 | 12/1976 | Susset | 341/145 |
| 4,491,825 | 1/1985 | Tuthill | 341/145 |
| 4,543,560 | 9/1985 | Holloway | 341/145 |
| 4,918,448 | 4/1990 | Hauviller et al. | 341/145 |
| 5,008,671 | 4/1991 | Tuthill | 341/136 |
| 5,111,205 | 5/1992 | Morlon | 341/156 |
| 5,252,975 | 10/1993 | Yuasa et al. | 341/145 |
| 5,319,371 | 6/1994 | Curtin et al. | 341/144 |

OTHER PUBLICATIONS

Grebene, *Bipolar and MOS Analog Integrated Circuit Design*, John Wiley & Sons, 1984, pp. 753–824.
Analog Devices, Inc., *Analog Devices 1992 Data Converter Reference Manual*, vol. 1, pp. 2–83 to 2–94 and 2–721 to 2–734.

*Primary Examiner*—Marc S. Hoff
*Attorney, Agent, or Firm*—Koppel & Jacobs

[57] ABSTRACT

The number of resistors and switches required for a voltage-scaling digital-to-analog converter (DAC) is greatly reduced by segmenting the voltage decrementing resistor string into two separate outer strings and an inner string. The outer strings decrement a full-scale voltage in accordance with the most significant bits (MSBs) of the input digital signal, while the inner string decrements the least significant bits (LSBs); alternately, the outer strings can decrement the LSBs and the inner string the MSBs. Opposite ends of the inner string are connected to corresponding points on the two outer strings through passive switched taps on the outer strings that allow the DAC to function as a potentiometer or rheostat, and "slide" up and down along the two outer strings as the input digital signal varies. An analog output is tapped from a selected point on the inner string whose voltage elevation is controlled by the switching of the outer strings. The outer strings are preferably switched in a sequence that adds a transient finite resistance to the circuit during switching, but avoids large scale glitches due to open circuits or short circuiting part of the string.

15 Claims, 5 Drawing Sheets

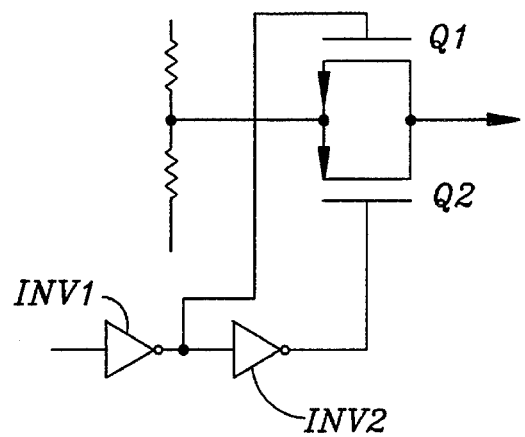
FIG. 4
```
                    SEQUENCE ─────────▶
    START      FINISH        1        2        3        4
    Sa2,Sb2    Sa6,Sb6      Sa6X     Sa20     Sb6X     Sb20
    Sa6,Sb6    Sa2,Sb2      Sb2X     Sb60     Sa2X     Sa60
```
FIG. 5
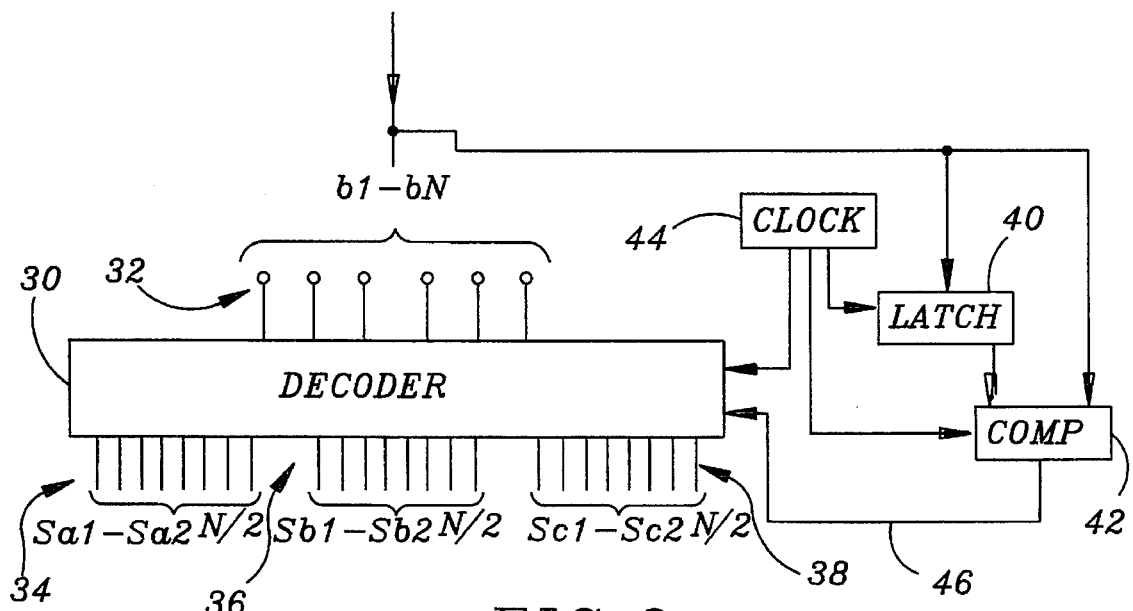
FIG. 6

DIGITAL-TO-ANALOG CONVERTER WITH SEGMENTED RESISTOR STRING

BACKGROUND OF THE INVENTION

1. Field of the Invention

This invention relates to digital-to-analog converters (DACs), and more particularly to voltage-scaling DACs.

2. Description of the Prior Art

The numerous types of DACs that are presently available can generally be categorized as current-scaling, voltage-scaling or charge-scaling devices. A general discussion of DACs is provided in Grebene, *Bipolar and MOS Analog Integrated Circuit Design*, John Wiley & Sons, 1984, pages 753–824.

Voltage-scaling DACs produce an analog output voltage by selectively tapping a voltage-divider resistor string connected between high and low reference voltages, with the low reference generally being set at ground. These types of converters are used most commonly as building blocks in MOS analog-to-digital conversion systems, where they function as the DAC subsection of a successive-approximation-type analog-to-digital converter. For an N-bit voltage-scaling DAC, the resistor string consists of $2^N$ identical resistors connected in series, and is used as a potentiometer in which the voltage levels between successive resistors are sampled by means of binary switches. Replacing mechanical potentiometers and rheostats is an important and potentially very high volume application for these devices.

FIG. 1 is a schematic diagram of an N-bit DAC that operates on the voltage-scaling principle. A resistor string consisting of resistors R1, R2, R3, ..., $R2^N-1$, $R2^N$ is connected between a high reference voltage (VREF+) node 2 and a low reference voltage (VREF−) node 4, which are typically 5 volts and ground potential, respectively. The voltage drop across each resistor is equal to one least significant bit (LSB) of output voltage change. The output is sampled by a decoding switch network, illustrated as switches S1, S2, S3, ..., $S2^N$. Each switch taps a different point in the resistor string, so that closing a particular switch while leaving the other switches open places a unique analog voltage on a common output line 6 to which each of the switches is connected. A decoder (not shown) controls the operation of the switches so that the switch whose voltage corresponds to the magnitude of the input digital signal is closed. The signal on analog output line 6 is sensed by a high-impedance buffer amplifier or voltage follower A1, the output of which is connected to an output terminal 8 that provides the final output analog voltage. To ensure the accuracy of the conversion, the buffer amplifier should draw negligible DC bias current compared to the current within the resistor string.

A principal drawback of this type of circuit for high-bit-count D/A conversions is the very large number of components required: $2^N$ resistors, $2^N$ switches and $2^N$ logic drive lines. For example, in a 12-bit implementation, this approach would use 4,096 resistors, 4,096 switches and 4,096 logic drive lines. It would be highly desirable to significantly reduce this large number of elements for purposes of area savings, higher manufacturing yields and lower costs.

Voltage-scaling DACs are presently available which greatly reduce the number of required resistors and switches by using one resistor string consisting of $2^{N/2}$ resistors for the input digital signal's most significant bits (MSBs), and a separate resistor string also consisting of $2^{N/2}$ resistors for the LSBs. Each resistor in the LSB string has a resistance value equal to $\frac{1}{2}^{N/2}$ the resistance of each MSB resistor. The opposite ends of the LSB string are connected across one of the MSB resistors. By varying the MSB resistor selected for the LSB string connection and taking an output from the LSB string, outputs in one LSB increments can be obtained over the full range of one to $2^{N/2}-1$ LSBs. Two such circuits are the AD569 and AD7846 DACs by Analog Devices, Inc., described in the *Analog Devices* 1992 *Data Converter Reference Manual*, Vol. 1, pages 2–83 to 2–94 and 2–721 to 2–734. However, to preserve the constant resistance characteristic of the MSB string, active amplifier buffer circuits must be used to interface between the MSB string and its connection to the LSB string. This unfortunately makes the device unusable for potentiometer and rheostat purposes.

SUMMARY OF THE INVENTION

The present invention seeks to provide a voltage scaling DAC that has a much lower resistor, switch and logic line count that in previous circuit designs, but exhibits a performance at least as good as prior circuits and can be used as a potentiometer or rheostat.

These goals are achieved with a segmented resistor string design that employs two outer resistor strings and one inner string. The outer strings are used to provide a decremented voltage pattern that supplies an analog signal corresponding to the MSBs of the input digital signal while the inner string provides an analog signal corresponding to the LSBs; alternately, the outer strings can provide the LSBs and the inner string the MSBs. The two outer strings are identical, with the high voltage end of the first outer string connected to the high reference voltage, and the low voltage end of the second outer string connected to the low reference voltage. The opposite ends of the inner string are connected to the first and second outer strings through respective outer switch networks that are operated by a decoder; the decoder in effect causes the opposite ends of the inner string to "slide" along the two outer strings. This "sliding" keeps a constant number of outer string resistors in the circuit, regardless of where the outer strings are tapped. No active elements are required to buffer the inner string from the outer string, which allows the DAC to be used as a potentiometer or rheostat. The output voltage is obtained by tapping a desired location in the inner string.

In the preferred embodiment, regardless of whether the MSB values are produced by the inner or outer strings, each MSB resistor string includes $2^{N/2}-1$, resistors of resistance value R, and $2^{N/2}$ switches; each LSB string includes $2^{N/2}$ resistors of resistance value $R/2^{N/2}$, and $2^{N/2}$ switches. The result is a very large reduction in the number of both resistors and switches, compared to prior to voltage-scaling DACs.

A switching sequence is also employed that avoids either transient reductions in the resistance between the reference voltage nodes, or transient open circuits. When a change in the input digital signal occurs, the switching pattern for the outer resistor string that results in an increase in the total resistance between the reference voltage nodes is first altered to a pattern that corresponds to the new digital value, followed by altering the switching pattern for the other outer string. Both switching patterns are altered in make-before-break sequences to avoid open circuits.

These and further features and advantages of the invention will be apparent to those skilled in the art from the following detailed description, taken together with the accompanying drawings.

BRIEF DESCRIPTION OF THE DRAWINGS

FIG. 4 is a schematic diagram of a preferred switch used in the invention;

FIG. 5 is a table illustrating a preferred switching sequence used to respond to changes in the digital input signal;

FIG. 6 is a block diagram of a preferred decoder arrangement; and

DETAILED DESCRIPTION OF THE INVENTION

Rather than a continuous resistor string of $2^N$ resistors, the new DAC uses a segmented resistor string consisting of two outer strings and one inner string. The outer strings can decrement the input digital signal's MSBs and the inner string the LSBs, or vice versa. The two outer strings have identical structures, and decrement their portion of the input digital signal by "sliding" the inner string through the outer strings, such that equal numbers of resistors are added to the decrementing circuit by one outer string and subtracted by the other for each change in the digital input.

Figure 2:
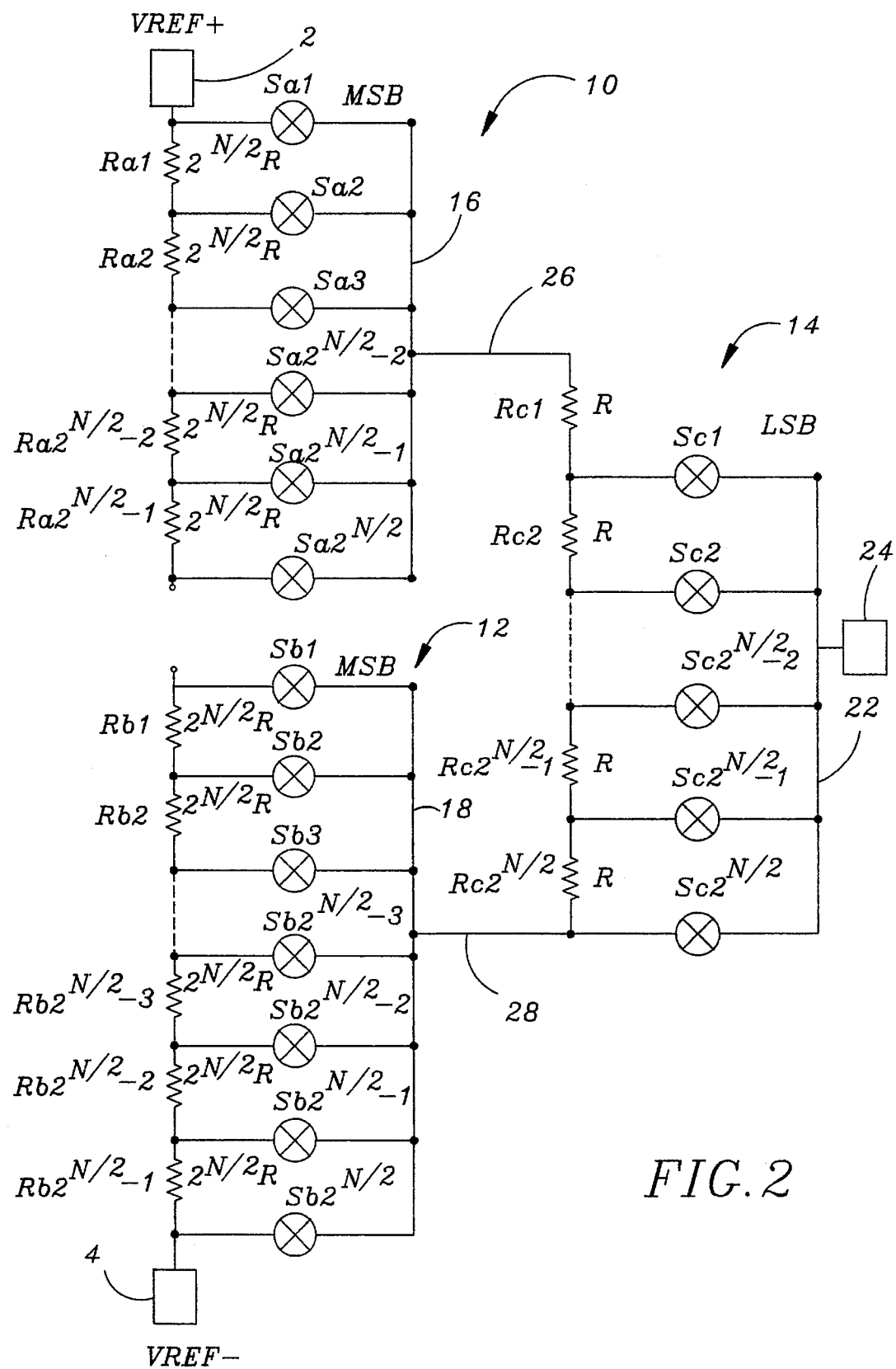
FIG. 2 is a schematic diagram of a DAC in accordance with the invention, with MSB outer resistor strings and an LSB inner string.

A generalized schematic diagram of a DAC for an N-bit input digital signal is shown in FIG. 2. The outer resistor strings 10 and 12 in this example decrement the input signal's MSBs, while the inner string 14 decrements the LSBs. The two outer string designs are identical. Each consists of $2^{N/2}-1$ series connected resistors of equal resistance values $2^{N/2}R$, with switched taps from each end of the strings and from the junctions of successive resistors. The resistors of the first string are designated Ra and extend from Ra1 to Ra$2^{N/2}-1$, while the resistors of the second string are designated Rb and extend from Rb1 to Rb$2^{N/2}-1$. The outer ends of Ra1 and Rb$2^{N/2}-1$ are connected to VREF+ and VREF−, respectively, while the outer ends of resistors Ra$2^{N/2}-1$ and Rb1 are left open.

The individual switches within the switch networks for resistor strings 10 and 12 are designated Sa and Sb, respectively. Switch Sa1 taps the outer end of Ra1, Sa2 taps the junction of Ra1 and Ra2, and so forth until switch Sa$2^{N/2}$, which taps the outer end of resistor Ra$2^{N/2}-1$. Switches Sb1 through Sb$2^{N/2}$ are connected to similar tap points in the second string 12. The opposite ends of the Sa switches from the Ra resistors are all connected together in a first string output line 16, while the opposite ends of switches Sb from the Rb resistors are all connected together in a second string output line 18.

Figure 1:
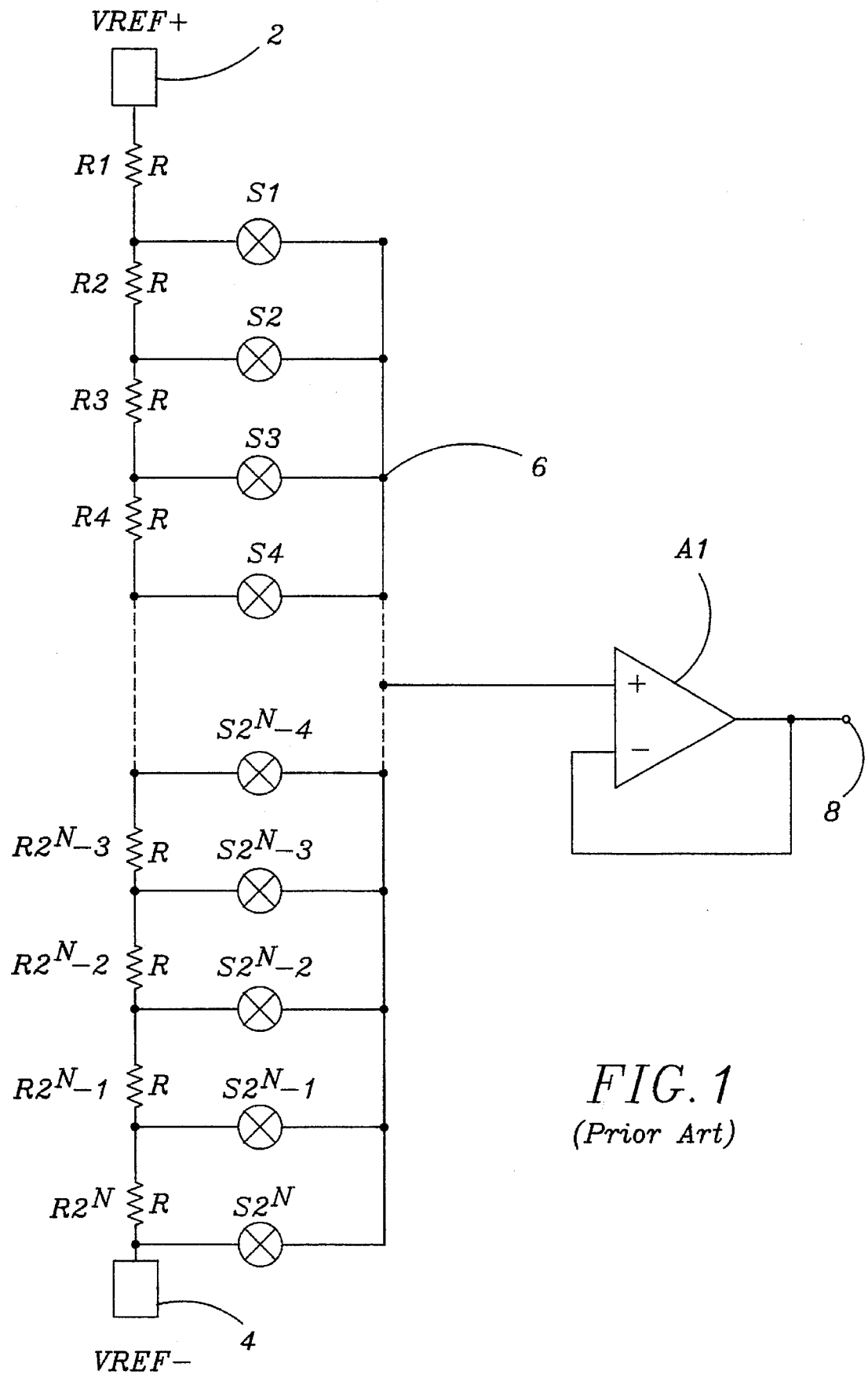
FIG. 1 is a schematic diagram of a prior voltage-scaling DAC, described above.

The inner or LSB string 14 consists of $2^{N/2}$ resistors designated Rc1 through Rc$2^{N/2}$, each with a resistance value R, and $2^{N/2}$ switches designated Sc1 through Sc$2^{N/2}$. The opposite ends of the switches from resistors Rc are all connected to a third string output line 22, which provides the overall DAC output at output terminal 24. An output buffer amplifier such as A1 (shown in FIG. 1) would normally not be used if the DAC is used for a potentiometer or rheostat function. The first switch Sc1 taps the junction of Rc1 and Rc2, with each successive switch tapping one successive resistor further down in the string until Sc$2^{N/2}$, which taps the outer end of resistor Rc$2^{N/2}$. With this configuration the DAC is capable of $2^N$ output levels in 1 LSB increments, with the lowest level equal to VREF− and the highest output level at 1 LSB below VREF+. Alternately, Sc1 could be tapped from the outer end of Rc1 and Sc$2^{N/2}$ could be tapped from the junction of the last two inner string resistors, yielding an output swing from 1 LSB above VREF− up to VREF+, although the former arrangement produces a more conventional output range.

The outer end of resistor Rc1 is connected to the first outer string output line 16 by a connector line 26, while the outer end of the last inner string resistor Rc$2^{N/2}$ is connected to the second inner string output line 18 by another connector line 28. A decoder (discussed below in connection with FIG. 6) controls the operation of the switches so that one switch in each of the three resistor strings is closed for any given digital input, with all of the other switches open. The switch networks for the two outer strings are controlled so that a total of $2^{N/2}-1$ resistors from the outer strings are connected in series with the inner string between VREF+ and VREF−. Thus, for any given digital input there will be a total of $2^{N/2}-1$ resistors of resistance value $2^{N/2}R$ and $2^{N/2}$ resistors of resistance value R, for a total resistance of $2^N R$, connected between VREF+ and VREF−. This is the same total resistance as in the prior art circuit of FIG. 1, but requires many fewer resistors. For example, for a 12-bit DAC, only 190 resistors (and 192 switches) are required, as opposed to 4,096 resistors (and 4,096 switches) with the prior circuit.

Figure 3:
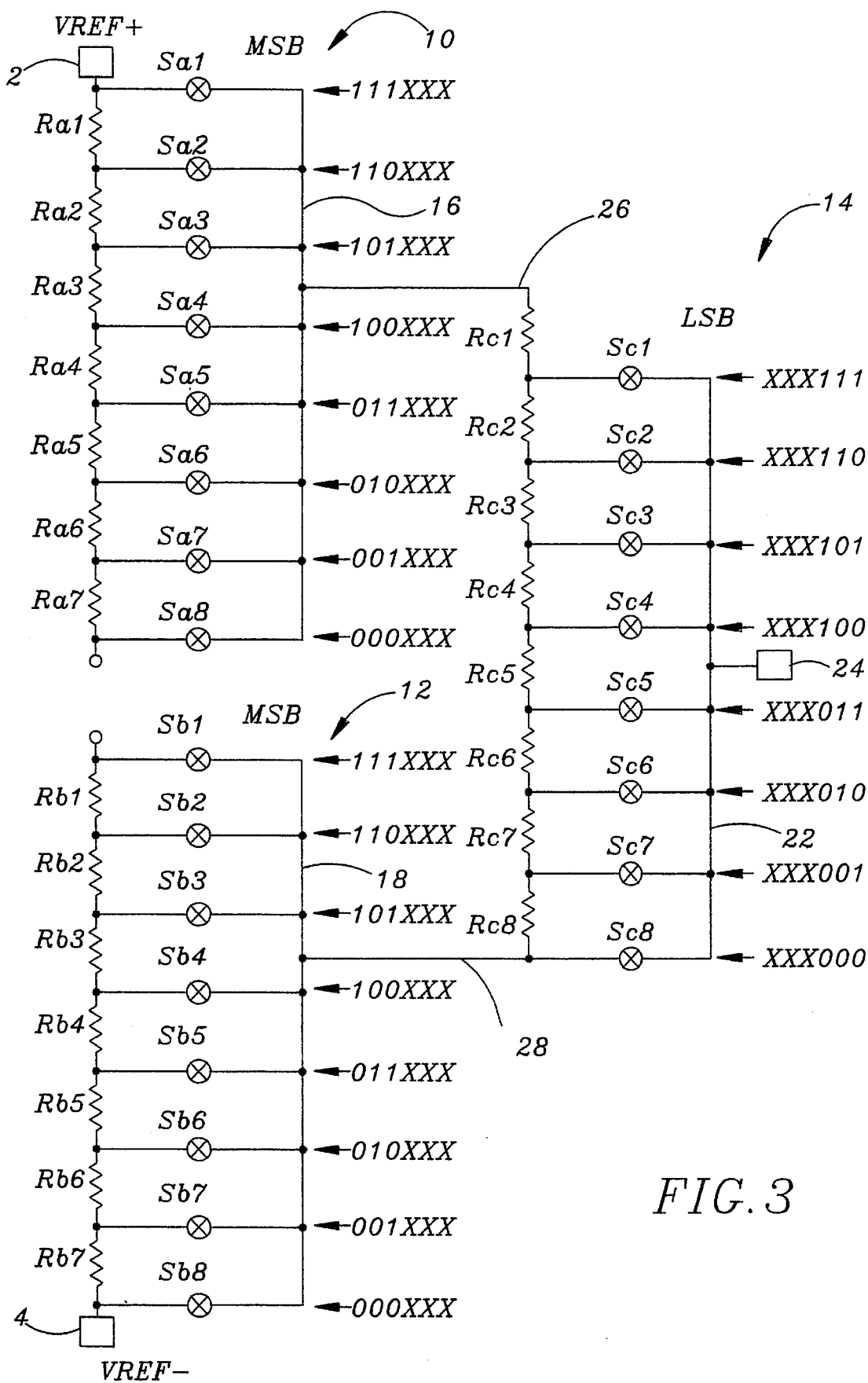
FIG. 3 is a schematic diagram of a 6-bit implementation of the invention, illustrating the MSB and LSB tap points.

The manner in which the switching is controlled to provide the DAC conversion function is illustrated in FIG. 3 for a 6-bit converter. The invention is most useful for higher resolution digital inputs, but the 6-bit example simplifies the drawing. The two outer strings 10 and 12 consist of resistors Ra1–Ra7 and Rb1–Rb7 and switches Sa1–Sa8 and Sb1–Sb8, respectively; the inner string consists of resistors Rc1–Rc8 and switches Sc1–Sc8. The three MSBs of the input digital signal are converted by the outer strings, while the three LSBs are converted by the inner string. Since for any given digital input a total of seven outer string resistors plus the inner string are connected in series between VREF+ and VREF−, and also since the total series resistance of the eight inner string resistors is equal to the resistance of a single outer string resistor, ⅛ of the voltage differential between VREF+ and VREF− appears across the inner string. The remaining ⅞ of the (VREF+)−(VREF−) differential is impressed across the portions of the outer strings that are included in the switched circuit. The output analog voltage at terminal 24 is equal to the voltage at the tapped location of the lower outer string 12, plus the voltage added by the tapped portion of the inner string. For example, if the input digital signal has a logic value 101010, switches Sb3 in the lower outer string 12, Sa3 in the upper outer string 10 and Sc6 in the inner string are closed, with all the other switches remaining open. As a result, resistors Ra1, Ra2, Rc1–Rc8 and Rb3–Rb7 are included in the series circuit between VREF+ and VREF−. The voltage at connector line 28 to the lower end of the inner string is elevated to ⅝ of the full scale voltage by the resistance divider effect, and the voltage at the output terminal 24 is elevated a further 2/64 of the full scale range over the voltage on line 28. The output analog voltage will therefore be 42/64 of full-scale.

Assume now that the input digital signal drops to a logic value 001110. In response, the decoder closes switches Sa7, Sb7 and Sc2, and opens the switches that were previously closed. Now resistors Ra1–Ra6, Rc1–Rc8 and Rb7 are included in the overall string between VREF+ and VREF–; the connector lines 26 and 28 in effect have had a "slide" down their respective outer resistor strings from Sa3 and Sb3 to Sa7 and Sb7. Connector line 28 is now at ⅛ the full-scale voltage above VREF– and output terminal 24 is another 6/64 of full-scale above line 28, for a total output analog voltage of 14/64 full-scale.

In FIG. 3 the corresponding input digital signal MSB values are indicated next to each of the outer string switches, beginning with 111 for Sa1 and Sb1 and progressing binarily down to 000 for Sa8 and Sb8. Similarly, the corresponding input digital LSB values are indicated next to the inner string switches, beginning with 111 for Sc1 and progressing binarily down to 000 for Sc8. The input digital bits are divided evenly between the inner and outer strings, with the three MSBs assigned to the outer strings and the three LSBs assigned to the inner string. Conceptually the division of input bits could be made unevenly, for example with the four MSBs assigned to the outer strings and the two LSBs to the inner string, but that would require a greater total number of both resistors and switches.

FIG. 4 is a schematic diagram of a preferred convention switching circuit that can be used for the various switches. It consists of a first inverter INV1 that receives an input from the decoder and provides an inverted bias signal to the gate of an n-channel CMOS transistor Q1, and a second inverter INV2 that inverts the output of INV1 and delivers a signal to the gate of a p-channel CMOS transistor Q2 that is connected in parallel with Q1. The drain of Q1 and source of Q2 are connected in common to the corresponding resistor string, while the source of Q1 and drain of Q2 are connected together to provide the switch output. The resulting switch has a very rapid response to changes in the decoder input. If it is desired to reduce the differential in the range of resistances for the inner and outer strings, each outer string resistor can be implemented as a number of lower value resistors connected in series, while each inner string resistor can be implemented as a number of higher value resistors connected in parallel.

The invention also includes a special switching sequence that minimizes output glitches. In switching the conventional DAC of FIG. 1 from one digital input level to another, the switch that was originally closed must be opened and a new switch closed. This can be done by either closing the new switch and then opening the first switch (make-before-break), or by opening the first switch and then closing the new switch (break-before-make). The make-before-break operation results in short-circuiting a portion of the resistor string and thus momentarily reducing the total resistance across VREF+ and VREF–, while break-before-make results in a momentary open circuit between the output and the resistor string and between VREF+ and VREF–. With the new DAC of FIG. 2, the preferred switching sequence for the outer strings significantly reduces the glitches associated with the prior switching techniques.

The two outer strings are switched in sequence, not simultaneously. The outer string whose switching will result in an increase in the total resistance between VREF+ and VREF– is switched first in a make-before-break fashion, followed by switching the other outer string, also in a make-before-break fashion. While this produces a small-scale glitch because of the momentary increase in total resistance, it is significantly less severe than the glitches associated with the prior switching techniques. The inner string can be switched in either a make-before-break or a break-before-make sequence, since any glitch associated with this switching operation will only be on an LSB scale, although make-before-break is preferred.

FIG. 5 illustrates the preferred switching sequence for the outer strings, and refers to the elements shown in FIG. 3. Assume that initially switches Sa2 and Sb2 are closed, and that a new digital input is presented that requires switches Sa6 and Sb6 to be closed. The first step in the switching sequence is to close switch Sa6. This does not effect the total resistance across VREF+ and VREF– since switch Sa2 is still closed. In the second step Sa2 is opened; this adds four outer string resistors (Ra2–Ra5) to the overall resistance between the two reference terminals. Next Sb6 is closed, and finally Sb2 is opened in the fourth step. To return to the original switching pattern, Sb2 is first closed and then Sb6 opened, adding resistors Rb2–Rb5 to the overall resistance between the reference voltages. The upper string is then switched, with Sa2 first closing and then Sa6 opening to complete the switching sequence.

FIG. 6 is a block diagram of a decoder setup that is suitable for the invention. The decoder 30 has a series of inputs 32 for receiving an input digital signal consisting of bits b1–bN. It decodes the input signal into corresponding control signals for the switches of each string, using conventional decoding techniques. One set of switch control outputs 34 is produced for switches $Sa1-Sa2^{N/2}$ of the first outer string (referring to FIG. 2), another set 36 for switches $Sb1-Sb2^{N/2}$ of the second outer string, and a third set 38 for switches $Sc1-Sc2^{N/2}$ of the inner string.

To provide the sequenced switching illustrated in FIG. 5, the input digital signal is also delivered to a digital latch 40 and to one input of a digital comparator 42. Under the control of a system clock 44, the comparator 42 compares the current digital input with the previous digital input stored in latch 40. The comparator determines whether the input digital value has increased or decreased, and transmits a corresponding signal over line 46 to the decoder to control the sequence to the switching operations.

Figure 7:
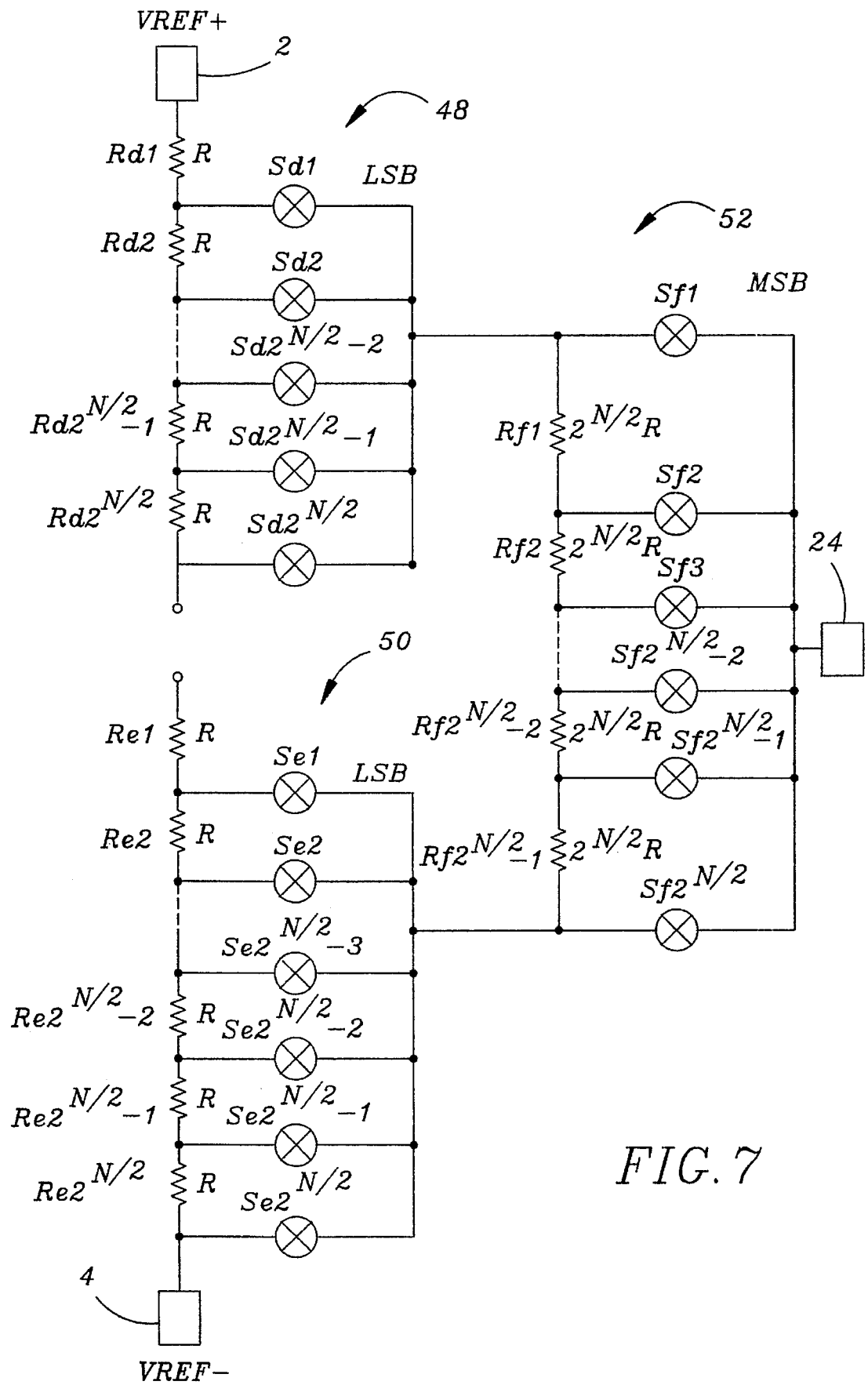
FIG. 7 is a schematic diagram of a DAC with LSB outer resistor strings and an MSB inner string.

The invention has been described thus far with MSB outer strings and an LSB inner string. This arrangement can be reversed, with the outer string providing an LSB decoding and the inner string an MSB decoding. This is illustrated in FIG. 7, in which the first outer string 48 consists of resistors $Rd1, Rd2, \ldots, Rd2^{N/2}-1, Rd2^{N/2}$, each with a resistive value of R, with switches $Sd1, Sd2, \ldots, Sd2^{N/2}-1, Sd2^{N/2}$ tapping the opposite side of each respective resistor from the VREF+ terminal 2. Similarly, the second outer string 50 consists of $2^{N/2}$ resistors ($Re1-Re2^{N/2}$) of resistance values R each, with $2^{N/2}$ switches ($Se1-Se2^{N/2}$) tapping the VREF– side of each respective resistor.

The inner MSB string 52 has the same structure as each of the outer MSB strings in FIG. 2. It consists of $2^{N/2}-1$ resistors ($Rf1-Rf2^{N/2}-1$), each of resistance value $^{N/2}R$, and $2^{N/2}$ switches ($Sf1-Sf2^{N/2}$) tapping the outer ends of the inner string and the junctions between successive Rf resistors.

The opposite ends of the inner string 52 "slide" up and down the outer strings as in the previous embodiment. In this case the MSB output is controlled by closing one of the inner string switches, while the LSB output is controlled by closing corresponding switches in the two outer strings. This embodiment provides the same reduction in switches and resistors as in FIG. 2.

In both embodiments the connections between the inner and outer strings are passive, being implemented by direct switched connections without the need for buffer amplifiers or other active circuits between the switched strings. The total outer string resistance switched into the DAC circuit remains constant, regardless of either the outer of the inner string switching selections. This lack of active circuitry allows the DAC to be used as a substitute for a mechanical potentiometer or rheostat.

While different embodiments of the invention have been shown and described, numerous variations and alternate embodiments will occur to those skilled in the art. Accordingly, it is intended that the invention be limited only in terms of the appended claims.

I claim:

1. A segmented digital-to-analog converter (DAC) for an N-bit digital signal, comprising:

high and low analog reference voltage nodes, an analog output node, first and second separate outer strings of respective predetermined series connected resistors, one end of the first outer resistor string being connected to said high reference voltage node and one end of the second outer resistor string being connected to the low reference voltage node, the resistors of each outer string being connected directly in series, an inner string of series connected resistors, first and second outer switch networks connected respectively to said first and second outer resistor strings to provide selectable unbuffered taps from said outer resistor strings to opposite ends of said inner resistor string, an inner switch network connected to said inner resistor string to provide a selectable tap from said inner resistor string to said output node, and a decoder which responds to an input digital signal by controlling said first and second outer switch networks to switch selectable portions of said outer resistor strings into a series connection with said inner resistor string, the selected portions having a substantially constant aggregate series resistance over the switching ranges of said outer switch networks, said decoder further controlling said inner switch network to tap said inner resistor string at a location whose analog voltage level corresponds to said digital input signal, the number and resistance values of the resistors in said outer resistor strings decrementing the voltage between said high and low reference voltage nodes in a manner that corresponds to either the most significant bits (MSBs) or the least significant bits (LSBs) of said input digital signal, and the number and resistance values of the resistors in said inner resistor string decrementing the voltage between said outer resistor strings in a manner that corresponds to the other of said MSBs and LSBs.

2. The segmented DAC of claim 1, wherein each of said outer switch networks comprises a common node connected to a respective end of said inner resistor string, and a plurality of switches connected between said common node and respective resistors in the corresponding resistor strings.

3. The segmented DAC of claim 2, wherein said first and second outer resistor strings have equal numbers of resistors with substantially equal resistances, and said decoder controls the switching of said outer switch networks so that a constant total number of resistors from said outer resistors strings are connected in series with said inner resistor string for all switch selections.

4. The segmented DAC of claim 2, wherein said decoder alters the switching patterns of each outer switch network in respective make-before-break sequences.

5. The DAC of claim 4, wherein said decoder alters the switching pattern of said switch network in response to a change in the input digital signal by first increasing the total resistance between said high and low reference voltage nodes and then restoring said total resistance to an initial value.

6. The segmented DAC of claim 1, wherein each MSB resistor string includes $2^{N/2}-1$ equal value resistors.

7. The segmented DAC of claim 6, wherein each LSB resistor string includes $2^{N/2}$ equal value resistors.

8. The segmented DAC of claim 7, wherein the resistance value of each resistor in each MSB resistor string is N times the resistance value of each resistor in each LSB resistor string.

9. The segmented DAC of claim 1, wherein said decoder alters the switching pattern of said outer switch networks in response to a change in the input digital signal by first altering the switching switch network for the outer string that results in an increase in the total resistance between said high and low reference voltage nodes, and then altering the switching pattern of the switch network for the other outer string.

10. A digital-to-analog converter (DAC) for an n-bit digital signal comprised of most significant bits (MSBs) and least significant bits (LSBs), comprising:

high and low reference voltage nodes, a pair of separate outer resistor strings having respective predetermined resistors, with one end of each string connected to a respective reference voltage node, both of said outer resistor strings decrementing an applied voltage in accordance with either a MSB or a LSB pattern, and including taps at corresponding decremented MSB or LSB locations along the string, the resistors of each outer being connected directly in series, an inner resistor string for decrementing an applied voltage in accordance with the LSB or MSB pattern that is not used by said outer strings, and including selectable output taps at corresponding decremented LSB or MSB locations along the string, a switch network connecting said inner resistor string between selectable unbuffered taps of said outer resistor strings so that the total resistance between said high and low voltage reference nodes remains constant for all switch selections, and a decoder connected to receive an input digital signal and to select a switch network configuration and an output tap from said inner resistor string that yield a corresponding analog signal at the selected inner resistor string tap.

11. The DAC of claim 10, wherein said switch network comprises, for each of said outer resistor strings, a common node connected to an end of said inner resistor string, and a plurality of switches connected between said common node and respective resistors in the corresponding outer resistor string.

12. The DAC of claim 11, wherein said first and second outer resistor strings have equal numbers of resistors with substantially equal resistances, and said decoder controls the switching of said outer switch networks so that a constant total number of resistors from said outer resistors strings are connected in series with said inner resistor string for all switch selections.

13. The DAC of claim 10, wherein each MSB resistor string includes $2^{N/2}-1$ equal value resistors.

14. The DAC of claim 13, wherein each LSB resistor string includes $2^{N/2}$ equal value resistors.

15. The DAC of claim 14, wherein the resistance value of each resistor in each MSB resistor string is N times the resistance value of each resistor in each LSB resistor string.

* * * * *